(12) United States Patent
Hoshi

(10) Patent No.: US 12,652,975 B2
(45) Date of Patent: Jun. 9, 2026

(54) SEMICONDUCTOR DEVICE

(71) Applicant: FUJI ELECTRIC CO., LTD.,
Kawasaki (JP)

(72) Inventor: Yasuyuki Hoshi, Matsumoto-city (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 510 days.

(21) Appl. No.: 18/305,786

(22) Filed: Apr. 24, 2023

(65) Prior Publication Data

US 2023/0395367 A1     Dec. 7, 2023

(30) Foreign Application Priority Data

Jun. 2, 2022     (JP) ................................. 2022-090298

(51) Int. Cl.
| | |
|---|---|
| *H01L 21/02* | (2006.01) |
| *H10D 62/832* | (2025.01) |
| *H10P 14/68* | (2026.01) |
| *H10W 74/10* | (2026.01) |
| *H10W 74/47* | (2026.01) |

(52) U.S. Cl.
CPC ....... *H10P 14/683* (2026.01); *H10D 62/8325*
(2025.01); *H10W 74/137* (2026.01); *H10W*
*74/47* (2026.01)

(58) Field of Classification Search
CPC ............. H01L 21/02118; H01L 23/293; H01L
23/3171; H10D 62/8325; H10P 14/683;
H10W 74/137; H10E 74/47
See application file for complete search history.

(56) References Cited

U.S. PATENT DOCUMENTS

2020/0395314 A1* 12/2020 Yoshida ................ H01L 23/562
2023/0062370 A1*  3/2023 Lin ..................... H01L 21/6835

FOREIGN PATENT DOCUMENTS

| JP | 6264230 B2 | 1/2018 |
|---|---|---|
| JP | 6906681 B2 | 7/2021 |
| WO | 2019171523 A1 | 9/2019 |

OTHER PUBLICATIONS

Office Action issued for corresponding Japanese Patent Application
No. 2022-090298 on Feb. 3, 2026.

* cited by examiner

*Primary Examiner* — Victor A Mandala
*Assistant Examiner* — Colleen E Snow
(74) *Attorney, Agent, or Firm* — Rabin & Berdo. P. C.

(57) ABSTRACT

A semiconductor device has a semiconductor base substrate,
a first electrode disposed on the surface of the semiconduc-
tor base substrate, a protective film covering an end portion
of the first electrode, and a second electrode disposed on the
first electrode, in an opening of the protective film. The
protective film has an end portion where the protective film
and the second electrode overlap. In a plan view of the
semiconductor device, the end portion has a convex portion
with a first radius of curvature and a concave portion with a
second radius of curvature. The convex portion protrudes in
a direction away from the opening, and the convex portion
is recessed toward the opening. The first radius of curvature
is larger than the second radius of curvature.

7 Claims, 4 Drawing Sheets

SEMICONDUCTOR DEVICE

CROSS REFERENCE TO RELATED APPLICATIONS

This application is based upon and claims the benefit of priority of the prior Japanese Patent Application No. 2022-090298, filed on Jun. 2, 2022, the entire contents of which are incorporated herein by reference.

BACKGROUND OF THE INVENTION

1. Field of the Invention

Embodiments of the invention relate to a semiconductor device.

2. Description of the Related Art

A power semiconductor module incorporates therein one or more semiconductor devices, constitutes a part of or an overall connection for conversion between direct current (DC) and alternating current (AC), or voltage/current conversion between DC and DC, or AC and AC, and is a power semiconductor device that has a structure in which the semiconductor device(s) and a multi-layer substrate or a metal substrate are electrically insulated from each other. Industrial applications of the power semiconductor module include use in a motor driving control inverter or the like for an elevator, etc. Furthermore, recently, power semiconductor modules are widely used in on-vehicle motor driving control inverters. An on-vehicle inverter is disposed in a vicinity of the driving motor in the engine room and reductions in the size and the weight thereof are necessary to improve fuel efficiency, and long-term reliability for high-temperature operation is further required thereof.

A semiconductor device containing, for example, silicon (Si) or silicon carbide (SiC) as the base material thereof is often used in a semiconductor device employed in the power semiconductor module. FIG. 6 is a top view depicting a structure of a conventional semiconductor device. As depicted in FIG. 6, a semiconductor device 150 includes an active region 140 through which a current flows during an on-state, and an edge termination region 141 that surrounds a periphery of the active region 140 and that maintains a withstanding voltage, and the active region 140 has a front electrode not depicted and a gate electrode pad 122 disposed thereon that each contain, for example, Al (aluminum). The semiconductor device 150 is, for example, a semiconductor device that has a MOS gate (that is, an insulated gate including a metal, an oxide film, a semiconductor) structure (the element structure) formed on a semiconductor substrate.

In a periphery of the front electrode of the semiconductor device, a polyimide film (a passivation film) 124 is formed on the front electrode as a protective film to prevent diffusion of ions into the semiconductor device and to insulate the semiconductor device. A SiN (silicon nitride) film or an inorganic material has conventionally been used as the protective film while the polyimide film 124 that is an organic material is often used. The polyimide film 124 is formed in a wet method such as a spin coating method or an ink-jet method, and an effect is achieved that the formation of the polyimide film 124 is easier than the formation of an inorganic material film is.

To facilitate the bonding of a non-depicted lead frame wire to the front electrode using solder (not depicted), a plating film 120 containing nickel (Ni) or the like is disposed in an opening of the polyimide film 124. When the plating film 120 is formed using Ni or the like by a plating treatment, the polyimide film 124 functions as a mask so that the plating film 120 is selectively precipitated on the front electrode. The plating film 120 partially overlaps an end portion 121 of the polyimide film.

According to a known method, the shape of the end portion 121 of the polyimide film on the front electrode is set to wrap a portion having a convex shape that bulges outwardly in a planar view and a radius of curvature (R) of this portion is set to be at least 200 μm (refer to Japanese Patent No. 6906681). As a result, stress is alleviated, adhesiveness is improved between the plating film 120 formed in the opening of the polyimide film 124 on the front electrode, and the polyimide film 124, and electrode corrosion of the front electrode containing Al and the plating film 120 containing Ni may be suppressed.

SUMMARY OF THE INVENTION

According to an embodiment of the invention, a semiconductor device, includes: a semiconductor base substrate; a first electrode disposed on a surface of the semiconductor base substrate; a protective film covering an end portion of the first electrode and having an opening; and a second electrode disposed on the first electrode, in the opening of the protective film. The protective film has an end portion where the protective film and the second electrode overlap. In a plan view of the semiconductor device, the end portion has a convex portion with a first radius of curvature and a concave portion with a second radius of curvature, the convex portion protruding in a direction away from the opening, the concave portion being recessed toward the opening. The first radius of curvature is larger than the second radius of curvature.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
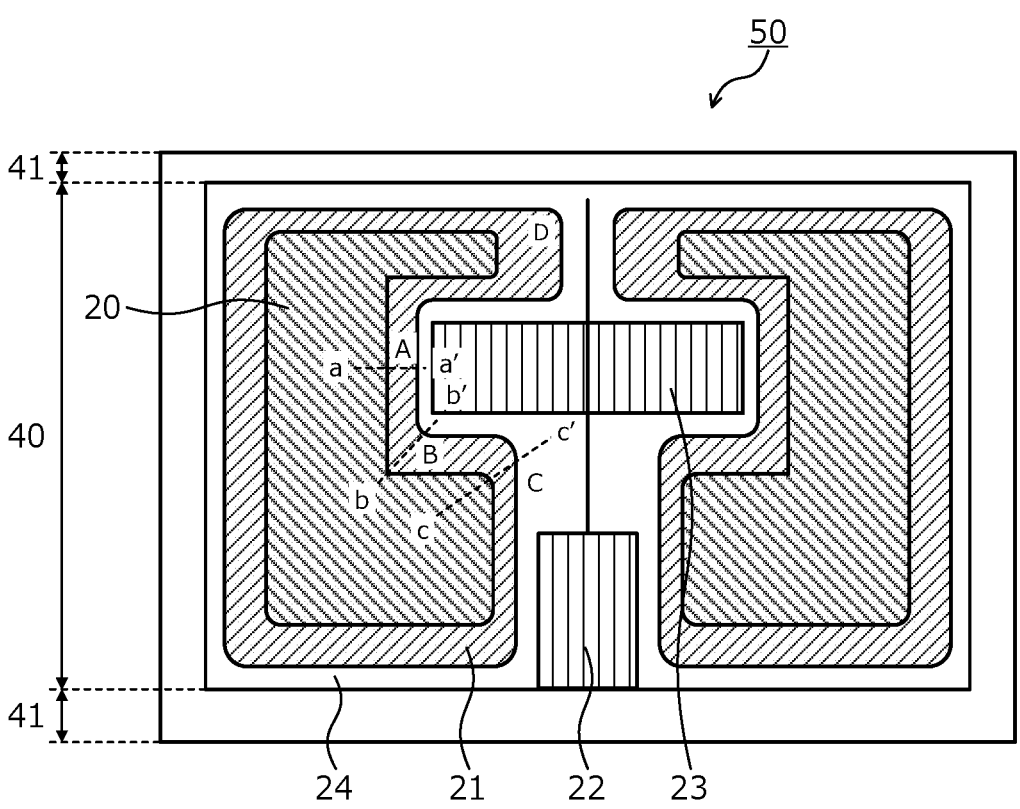
FIG. 1 is a top view depicting a structure of a semiconductor device according to an embodiment.

First, problems associated with the conventional techniques are discussed. As for the conventional semiconductor device 150, to further improve the reliability thereof, a semiconductor device having high function regions such as a current sensing portion not depicted, a temperature sensing portion not depicted, and an overvoltage protecting portion not depicted disposed in a single semiconductor substrate together with the main semiconductor device has been proposed. In an instance in which such high function regions are disposed, convex shapes are formed in addition to those at the four corners at the end portion 121 of the polyimide film, and a pattern including multiple convex shapes is formed.

Nonetheless, the above conventional method copes with only a pattern whose shape of the front electrode is a substantially rectangular shape and whose convex shape is single on the end portion 121 of the polyimide film, and does not cope with any pattern that includes plural convex shapes. Thus, a problem arises in that a portion having weakened adhesiveness between the plating film 120 and the polyimide film 124 occurs, a void is generated at the border between the plating film 120 and the polyimide film 124 in this portion, local corrosion of both the front electrode containing Al and the plating film 120 containing Ni starts from this void portion, whereby the reliability degrades.

Embodiments of a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

An embodiment of a semiconductor device according to the present invention is described below in detail with reference to the accompanying drawings. FIG. 1 is a top view depicting the structure of the semiconductor device according to the embodiment. The semiconductor device 50 according to the embodiment depicted in FIG. 1 may be a vertical-type semiconductor device in which a drift current flows in the depth direction of the semiconductor substrate thereof in the on-state.

The semiconductor device 50 is a semiconductor device such as an insulated gate bipolar transistor (IGBT), metal oxide semiconductor field effect transistor (MOSFET) insulated gates with a three-layer structure including a metal, an oxide film, and a semiconductor, or a diode chip.

An active region 40 is a region through which current flows during an on-state and an edge termination region 41 surrounds a periphery of the active region mitigates electric field of a front side of the semiconductor device 50, and sustains a breakdown voltage. In the edge termination region 41, for example, a non-depicted voltage withstanding structure such as a field limiting ring (FLR) or a junction termination extension (JTE) structure is disposed. The breakdown voltage is a voltage limit at which no malfunction or destruction of the device occurs.

The active region 40 has a non-depicted main effective region through which a main current flows when the semiconductor device 50 is turned on, and a non-depicted circuit portion for protecting and controlling the semiconductor device disposed therein. The main effective region has, for example, a substantially rectangular shape in a plan view of the device and occupies a large portion of the surface area of the active region 40. The circuit portion includes high function portions such as, for example, a current sensing portion, a temperature sensing portion, an overvoltage protecting portion, and a computing circuit portion.

A front electrode (a first electrode) 12 is disposed on the main effective region. The front electrode 12 is covered by a plating film 20 and a polyimide film (a protective film) 24 that are described later and is therefore not depicted in FIG. 1 (see FIG. 2 to FIG. 4). The front electrode 12 is a source electrode in the case of a MOSFET, is an emitter electrode in the case of an IGBT, and is formed by an aluminum-silicon alloy (AlSi). The front electrode 12 is not limited to one formed by AlSi.

The polyimide film 24 is formed on the front electrode 12. To facilitate bonding of a non-depicted lead frame wire to the front electrode 12 using solder not depicted, the plating film (a second electrode) 20 is disposed in an opening of the polyimide film 24. The polyimide film 24 is a resin film that functions as a protective film. The resin film is not limited to a polyimide film, may be another organic resin film, and may further be a film of an inorganic material such as a silicon nitride (SiN) film.

The plating film 20 may be a film containing Ni or an Ni alloy such as nickel phosphorus (NiP) or nickel boron (NiB), and may further be a film containing copper, aluminum, or gold. The plating film 20 may further be a multi-layer film of these. An Au plating film may be further formed on an Ni plating film. The plating film 20 overlaps an end portion 21 of the polyimide film (see FIGS. 2 to 4).

The front electrode 12 has a higher current capability compared to that of the other circuit portions, and therefore, covers substantially an entire area of the surface of the main effective region. The front electrode 12 is disposed apart from other electrode pads. The other electrode pads each has, for example, a substantially rectangular shape in the plan view of the device, and each has a surface area necessary for bonding an external terminal electrode or a wire. The other electrode pads are, for example, a gate electrode pad 22, electrode pads of the current sensing portion, a cathode pad and an anode pad of the temperature sensing portion, electrode pads of the overvoltage protecting portion, and electrode pads of the computing circuit portion.

FIG. 1 depicts the gate electrode pad 22 and a signal electrode pad 23 that includes the cathode pad and the anode pad of the temperature sensing portion, as the electrode pads other than the front electrode 12. The configuration of the electrode pads other than the front electrode 12 is not limited to the above configuration, and a configuration having therein multiple gate electrode pads 22, or a configuration having therein multiple signal electrode pads 23 may be employed, or the electrode pads may be the electrode pads of the current sensing portion, the electrode pads of the overvoltage protecting portion, the electrode pads of the computing circuit portion, and the like.

The electrode pads other than that of the front electrode 12 are disposed on the active region 40 of the semiconductor device 50 as described, and the end portion 21 of the polyimide film is therefore formed in a shape that avoids the electrode pads other than of the front electrode 12. Thus, the convex-shaped portions (convex portions) and the concave-shaped portions (concave portions) in the plan view are formed on the end portion 21 of the polyimide film. For example, a linear portion A in FIG. 1, a concave-shaped portion B in FIG. 1, a convex-shaped portion C in FIG. 1, and a corner portion D in FIG. 1 are formed. While the plating film 20 and the end portion 21 of the polyimide film are depicted only on one side in FIG. 1, the plating film 20 and the end portion 21 of the polyimide film may be formed on the opposite side, or the plating film 20 and the end portion 21 of the polyimide film may be formed only on the one side as in FIG. 1.

In the embodiment, the radius of curvature R of the polyimide film in the planar view is changed depending on whether the shape of the portion of the end portion 21 of the polyimide film is a concave shape or a convex shape. For example, a radius of curvature R2 of the convex-shaped portion C of the end portion 21 of the polyimide film is set to be larger than a radius of curvature R1 of the concave-shaped portion B of the end portion 21 of the polyimide film (R2>R1). For example, the radius of curvature R is changed by optimizing the difference in the cross-sectional shape by varying the side etching amount when the polyimide film 24 is formed. The radius of curvature R2 of the convex-shaped portion C may be preferably not more than 500 μm and more preferably, may be in a range of 20 μm to 180 μm, and the radius of curvature R1 of the concave-shaped portion B may be preferably 20 μm or more and more preferably may be in a range of 20 μm to 200 μm. A radius of curvature of the corner portion D may be preferably equal to the radius of curvature R1 of the concave-shaped portion B.

The difference of the radius of curvature R2 of the convex-shaped portion C and the radius of curvature R1 of the concave-shaped portion B (R2–R1) may be preferably in a range of 10 μm to 40 μm, or the ratio of the radius of curvature R2 of the convex-shaped portion C to the radius of curvature R1 of the concave-shaped portion B (R2/R1) may be preferably in a range of a 2-fold value to a 5-fold value.

The stress applied to the polyimide film 24 varies depending on the shape of the end portion 21 of the polyimide film; stress is more heavily applied to the convex-shaped portion C; and the adhesiveness between the plating film 20 and the polyimide film 24 is weakened. In the embodiment, therefore, cracks and stress applied after the formation of the plating film 20 may be alleviated, in particular, an occurrence of a void at the border of the portion having the weakened adhesiveness between the plating film 20 and the polyimide film 24 may be suppressed, local corrosion of both the front electrode 12 and the plating film 20 may be suppressed, and a semiconductor device having high reliability may be provided by setting the radius of curvature R2 to be large for the convex-shaped portion C to which the stress is more heavily applied.

Figure 2:
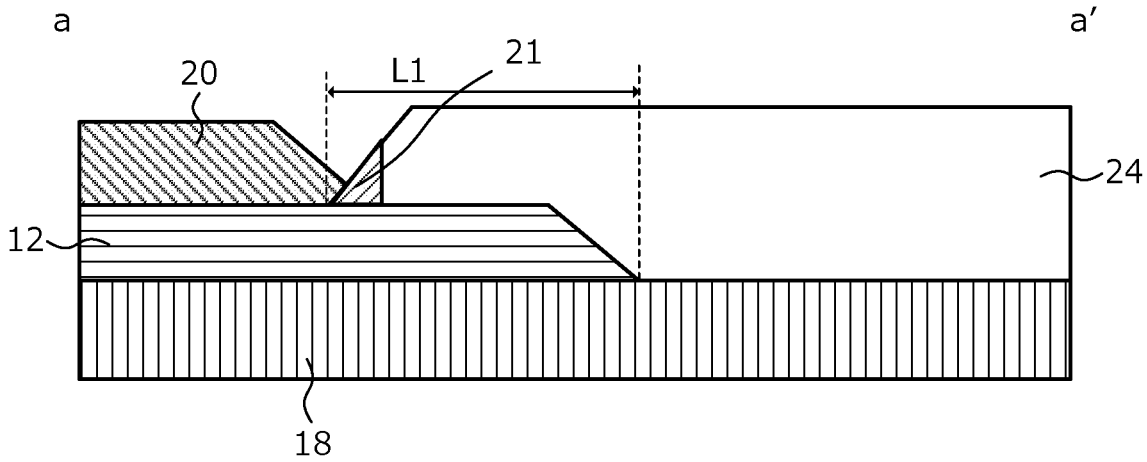
FIG. 2 is a cross-sectional view of a linear portion A in FIG. 1, which depicts the structure of the semiconductor device according to the embodiment.
Figure 3:
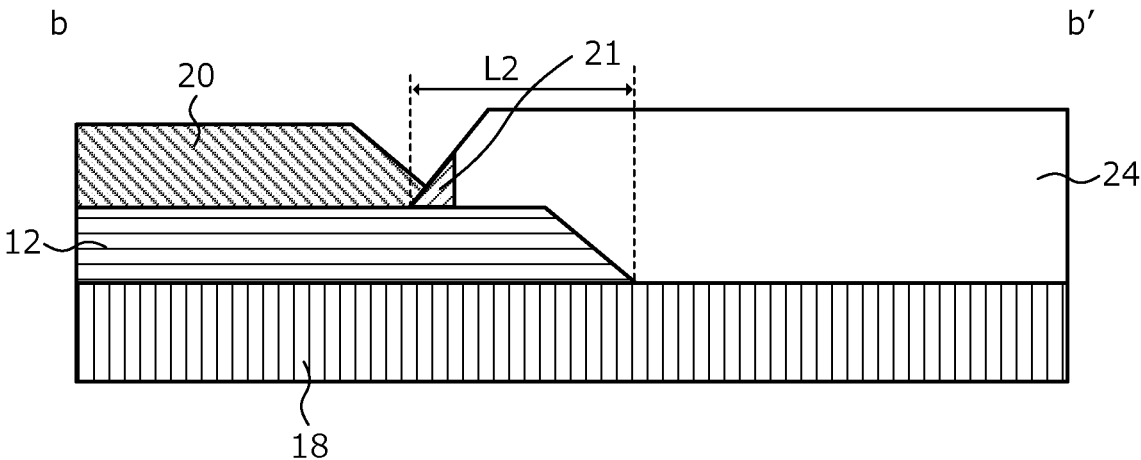
FIG. 3 is a cross-sectional view of a concave-shaped portion B in FIG. 1, which depicts the structure of the semiconductor device according to the embodiment.
Figure 4:
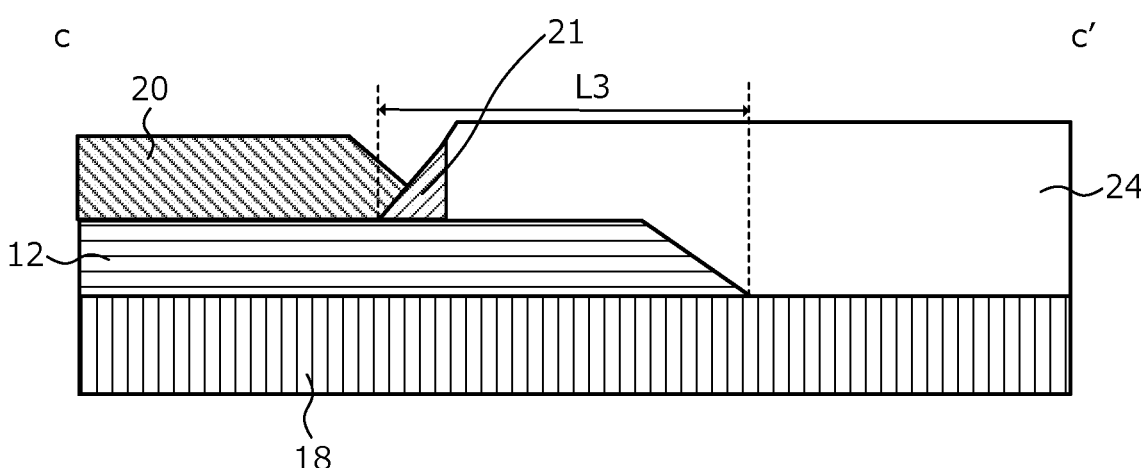
FIG. 4 is a cross-sectional view of a convex-shaped portion C in FIG. 1, which depicts the structure of the semiconductor device according to the embodiment.

FIG. 2 is a cross-sectional view of the linear portion A in FIG. 1, which depicts the structure of the semiconductor device according to the embodiment. FIG. 3 is a cross-sectional view of the concave-shaped portion B in FIG. 1, which depicts the structure of the semiconductor device according to the embodiment. FIG. 4 is a cross-sectional view of the convex-shaped portion C in FIG. 1, which depicts the structure of the semiconductor device according to the embodiment. FIG. 2 is the cross-sectional view along an a-a' portion in FIG. 1, FIG. 3 is the cross-sectional view along a b-b' portion in FIG. 1, and FIG. 4 is the cross-sectional view along a c-c' portion in FIG. 1.

As depicted in FIGS. 2 to 4, the front electrode 12 and the polyimide film 24 are disposed on a semiconductor base substrate 18. The polyimide film 24 partially covers the front electrode 12, and the plating film 20 is disposed in an opening that is not covered by the polyimide film 24, on the front electrode 12. The polyimide film 24 and the plating film 20 each have a sloped cross-section, and a portion of the plating film 20 overlaps the end portion 21 of the polyimide film 24. As to the length of the overlap of the polyimide film 24 and the front electrode 12, a relationship L2<L1<L3 is satisfied, where the length in the linear portion A is "L1", the length in the concave-shaped portion B is "L2", and the length in the convex shaped portion C is "L3". The length L1 in the linear portion A is longer than the length L2 in the concave-shaped portion B, and the length L3 in the convex-shaped portion C is longer than the length L1 in the linear portion A. Preferably the difference of the length L3 in the convex-shaped portion C and the length L2 in the concave-shaped portion B may be equal to the difference of their curvature radii, that is, R2–R1=L3–L2. Being equal means being equal within an error that is within 10% and thus, R2–R1 and L3–L2 are not strictly equal to each other.

Figure 5:
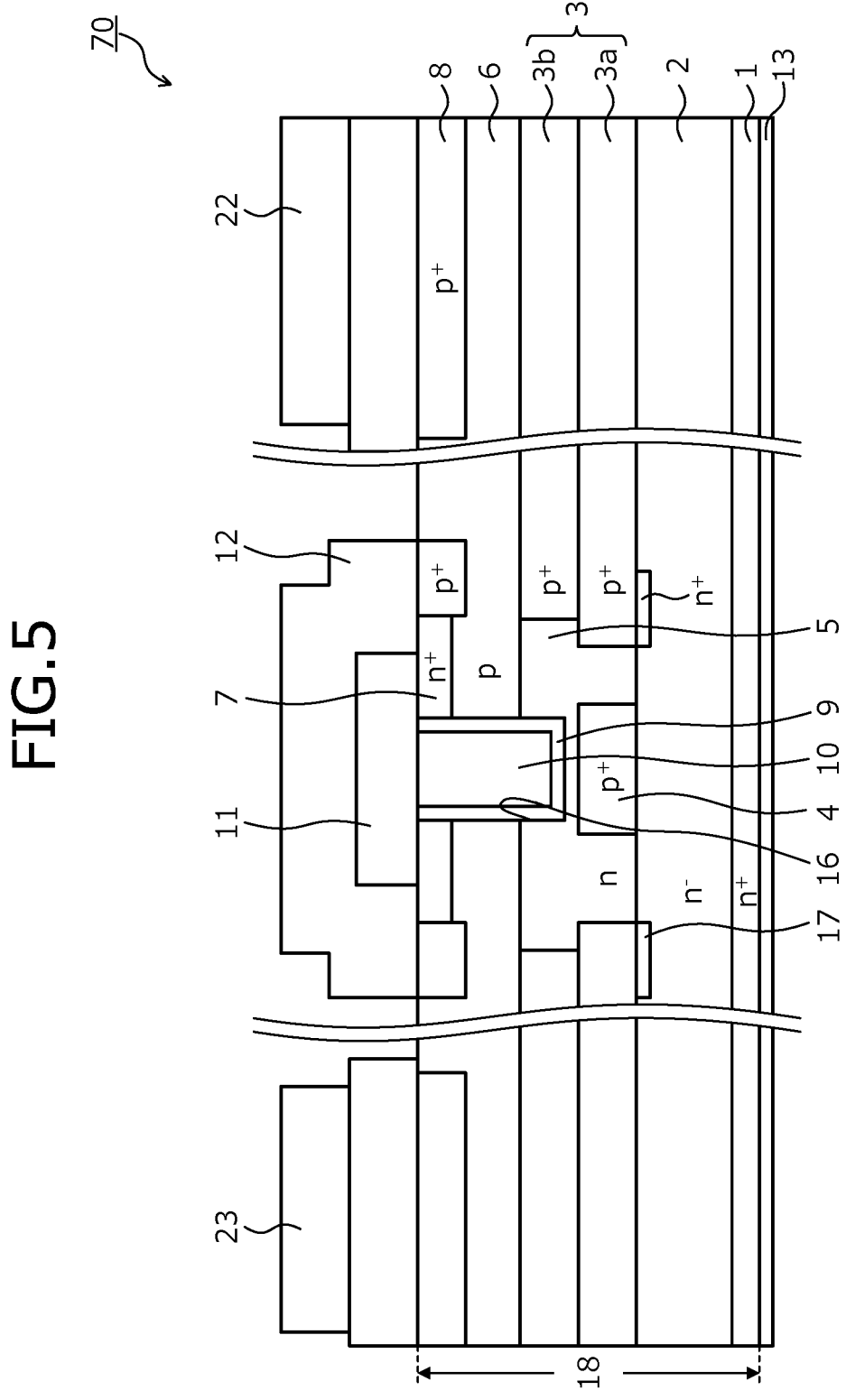
FIG. 5 is a cross-sectional view depicting a structure of a semiconductor base substrate of the semiconductor device according to the embodiment.
Figure 6:
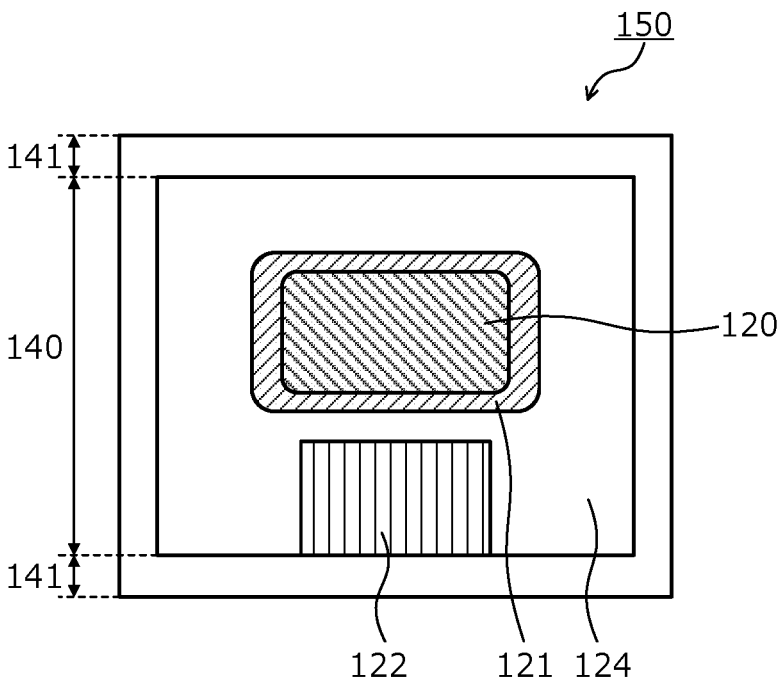
FIG. 6 is a top view depicting a structure of a conventional semiconductor device.

The semiconductor base substrate 18 includes multiple semiconductor layers that are disposed on a semiconductor substrate. FIG. 5 is a cross-sectional view depicting the structure of the semiconductor base substrate of the semiconductor device according to the embodiment. FIG. 5 depicts the semiconductor base substrate 18 in a case of a trench-type MOSFET 70 fabricated (manufactured) using silicon carbide (SiC).

As depicted in FIG. 5, in the semiconductor device according to the embodiment, an n⁻-type silicon carbide epitaxial layer 2 is deposited on a first main surface (the front face) such as, for example, a (0001) plane (an Si plane) of an n⁺-type silicon carbide substrate 1.

The n⁺-type silicon carbide substrate 1 is a silicon carbide single crystal substrate. The n⁻-type silicon carbide epitaxial layer 2 has an impurity concentration that is lower than that of the n⁺-type silicon carbide substrate 1 and is, for example, a low concentration n-type drift layer. An n-type high concentration region 5 may be disposed on a front surface of the n⁻-type silicon carbide epitaxial layer 2, opposite to a back surface thereof facing the n⁺-type silicon carbide substrate 1. The n-type high concentration region 5 is a high concentration n-type drift layer having an impurity concentration that is lower than that of the n⁺-type silicon carbide substrate 1 and is higher than that of the n⁻-type silicon carbide epitaxial layer 2.

A p-type base layer 6 is disposed on the front surface of the n⁻-type silicon carbide epitaxial layer 2, opposite to the back surface thereof facing the n⁺-type silicon carbide substrate 1. Hereinafter, the n⁺-type silicon carbide substrate 1, the n⁻-type silicon carbide epitaxial layer 2, the n-type high concentration region 5, and the p-type base later 6 constitute the semiconductor base substrate (a semiconductor substrate containing silicon carbide) 18.

A drain electrode constituting a back electrode 13 is disposed on a second main surface of the n⁺-type silicon carbide substrate 1 (a back surface, that is, the back surface of the semiconductor base substrate 18). A non-depicted drain electrode pad is disposed on the surface of the back electrode 13.

A trench structure is formed in the front side of (the side having the p-type base layer 6) of the silicon carbide semiconductor base substrate. For example, a trench 16 penetrates through the p-type base layer 6 from a front surface of the p-type base layer 6 (the surface facing the first main surface of the semiconductor base substrate), opposite to a back surface thereof facing the n⁺-type silicon carbide substrate 1, and the trench 16 reaches the n-type high concentration region 5 (or the n⁻-type silicon carbide epitaxial layer 2 denoted hereinafter simply by (2) in the case where the n-type high concentration region 5 is not disposed). Along an inner wall of the trench 16, a gate insulating film 9 is formed on a bottom and side walls of the trench 16, and a gate electrode 10 is formed on the gate insulating film 9 in the trench 16. The gate electrode 10 is insulated from the n-type high concentration region 5 (2) and the p-type base later 6 by the gate insulating film 9. A portion of the gate electrode 10 may protrude toward the later-described front electrode 12, from a top (the side where the front electrode 12 is disposed) of the trench 16.

A first p$^+$-type base region 3 is disposed between the trench 16 and an adjacent trench 16, in the n-type high concentration region 5 (2), at a front surface thereof facing the first main surface of the silicon carbide semiconductor base substrate, opposite to a back surface thereof facing the n$^+$-type silicon carbide substrate 1. A second p$^+$-type base region 4 is disposed in the n-type high concentration region 5 (2), at a position facing the bottom of the trench 16 in the depth direction (direction from the front electrode 12 to the back electrode 13). The first p$^+$-type base region 3 includes a lower first p$^+$-type base region 3a of a thickness equal to that of the second p$^+$-type base region 4, and an upper first p$^+$-type base region 3b that is in contact with the lower first p$^+$-type base region 3a and the p-type base layer 6. A width of the second p$^+$-type base region 4 is at least equal to a width of the trench 16. The bottom of the trench 16 may reach the second p$^+$-type base region 4 or may be positioned in the n-type high concentration region 5 that is sandwiched by the p-type base layer 6 and the second p$^+$-type base region 4.

An n*-type region 17 whose peak impurity concentration is higher than that of the n-type high concentration region 5 (2) is disposed in the n$^-$-type silicon carbide epitaxial layer 2, at a position deeper than that of the first n$^+$-type base region 3 between the trenches 16. A "deep position" refers to a position that is closer to the drain electrode 13 than is the first p$^+$-type base region 3.

An n*-type source region 7 is selectively disposed in the p-type base layer 6, at the front surface thereof facing the first main surface of the silicon carbide semiconductor base substrate 18. A p$^+$-type contact region 8 may be selectively disposed. An impurity concentration of the n$^+$-type source region 7 is higher than the impurity concentration of the n$^-$-type silicon carbide epitaxial layer 2. The impurity concentration of the p$^+$-type contact region 8 is higher than the impurity concentration of the p-type base layer 6.

An interlayer insulating film 11 is disposed in an entire area of the first main surface of the semiconductor base substrate 18 and covers the gate electrode 10 embedded in the trench 16. The front electrode 12 constituting the source electrode is in contact with the n$^+$-type source region 7 and the p-type base layer 6 through contact holes opened in the interlayer insulating film 11. In the case where the p$^+$-type contact region 8 is disposed, the front electrode 12 is in contact with the n$^+$-type source region 7 and the p$^+$-type contact region 8. The front electrode 12 is electrically insulated from the gate electrode 10 by the interlayer insulating film 11. A non-depicted source electrode pad is disposed on the front electrode 12. For example, a non-depicted barrier metal that prevents diffusion of metal atoms from the front electrode 12 to the gate electrode 10 may be disposed between the front electrode 12 and the interlayer insulating film 11.

A region in which the gate electrode pad 22 and the signal electrode pad 23 are disposed is free of the MOSFET structure, and in the region, the interlayer insulating film 11 is disposed on the semiconductor base substrate 18, and the semiconductor base substrate 18 is insulated from the gate electrode pad 22 and the signal electrode pad 23. The signal electrode pad 23 is an electrode pad that is connected to, for example, the current sensing portion and the temperature sensing portion.

As described above, according to the embodiment, the radius of curvature of the convex-shaped portion of the end portion of the polyimide film is set to be larger than the radius of curvature of the concave-shaped portion of the end portion of the polyimide film. Crack and stress applied after the plating film is formed may thereby be alleviated; in particular, an occurrence of voids generated at the border of the portion having weakened adhesiveness between the plating film and the polyimide film may be suppressed, local corrosion of both the front electrode and the plating film may be suppressed, and a semiconductor device having high reliability may be provided.

In the foregoing, various changes may be made to the present invention within the scope not departing from the spirit of the present invention and, in the described embodiment, for example, dimensions and impurity concentrations of regions, etc. are variously set according to necessary specifications and the like. The described embodiment is applicable to a semiconductor such as silicon (Si) or gallium nitride (GaN) in addition to silicon carbide (SiC) as the semiconductor.

According to the described invention, the radius of curvature of the convex-shaped portion of the end portion of the polyimide film is set to be larger than the radius of curvature of the concave-shaped portion of the end portion of the polyimide film. Cracks and stress applied after the plating film is formed may thereby be alleviated; in particular, the occurrence of a voids at the border of the portion having weakened adhesiveness between the plating film and the polyimide film may be suppressed, local corrosion of both the front electrode and the plating film may be suppressed, and a semiconductor device having high reliability may be provided.

According to the semiconductor device of the present invention, local corrosion of both the front electrode and the plating film may be suppressed and the reliability is high.

As described, the semiconductor device according to the present invention is useful for power semiconductor devices used in power converting equipment such as inverters, power source devices of various types of industrial machines, igniters for automobiles, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor base substrate;
   a first electrode disposed on a surface of the semiconductor base substrate;
   a protective film covering an end portion of the first electrode and having an opening; and
   a second electrode disposed on the first electrode, in the opening of the protective film, wherein
   the protective film has an end portion where the protective film and the second electrode overlap,
   in a plan view of the semiconductor device, the end portion of the protective film has a convex portion with a first radius of curvature and a concave portion with a second radius of curvature, the convex portion protruding in a direction away from the opening, the concave portion being recessed toward the opening, and the first radius of curvature is larger than the second radius of curvature.

2. The semiconductor device according to claim 1, wherein the first radius of curvature of the convex portion is not more than 500 μm, and the second radius of curvature of the concave portion is at least 20 μm.

3. The semiconductor device according to claim 1, wherein a difference between the first radius of curvature of the convex portion and the second radius of curvature of the concave portion is in a range of 10 μm to 40 μm.

4. The semiconductor device according to claim 1, wherein the first radius of curvature of the convex portion is two times to five times larger than the second radius of curvature of the concave portion.

5. The semiconductor device according to claim 1, wherein the end portion of the protective film has a linear portion in the plan view, and a first length of an overlap of the protective film and the first electrode in the linear portion is longer than a second length of the overlap in the concave portion, and is shorter than a third length of the overlap in the convex portion.

6. The semiconductor device according to claim 5, wherein a first difference between the third length of the convex portion and the second length of the concave portion is equal to a second difference between the first radius of curvature of the convex portion and the second radius of curvature of the concave portion.

7. The semiconductor device according to claim 1, wherein the first electrode contains an aluminum alloy, the second electrode contains a nickel alloy, and the protective film is a polyimide film.

* * * * *